US006258636B1

(12) United States Patent
Johnson et al.

(10) Patent No.: US 6,258,636 B1
(45) Date of Patent: Jul. 10, 2001

(54) SOI ACTIVE PIXEL CELL DESIGN WITH GROUNDED BODY CONTACT

(75) Inventors: Jeffrey B. Johnson, Essex Junction, VT (US); Hon-Sum P. Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/231,068

(22) Filed: Jan. 14, 1999

Related U.S. Application Data

(62) Division of application No. 09/004,429, filed on Jan. 8, 1998, now Pat. No. 5,877,521.

(51) Int. Cl.[7] .................................................. H01L 21/00
(52) U.S. Cl. ........................ 438/149; 438/151; 438/164; 257/223; 257/291
(58) Field of Search .................................... 438/149, 151, 438/164, 144; 257/223, 225, 291

(56) References Cited

U.S. PATENT DOCUMENTS

| 4,006,458 | 2/1977 | Booher . |
| 5,008,723 | 4/1991 | Van Der Have . |
| 5,145,802 | 9/1992 | Tyson et al. . |
| 5,358,879 | 10/1994 | Brady et al. . |
| 5,559,368 | 9/1996 | Hu et al. . |
| 5,572,045 | 11/1996 | Takahaski et al. . |
| 5,587,596 | 12/1996 | Chi et al. . |
| 5,614,744 | 3/1997 | Merrill . |
| 5,789,774 | 8/1998 | Merrill . |

*Primary Examiner*—Olik Chaudhuri
*Assistant Examiner*—William David Coleman
(74) *Attorney, Agent, or Firm*—DeLio & Peterson, LLC; Peter W. Peterson; Eugene I. Shkurko (57) ABSTRACT

A photosensitive device includes an array of active pixel sensor devices, each APS device being formed in an isolated cell of silicon. Each cell has an insulating barrier around it, and sits upon an insulating layer formed on an underlying substrate. A semiconductor connector making vertical contact between the pinning layer and the body of each APS device preferably replaces at least some portion of the insulating barrier adjacent to each cell. The semiconductor connector may be a single vertical connection for each cell or it may be an elongated strip connecting multiple APS devices. It may extend only to the underlying insulating layer or it may extend through the insulating layer to the substrate, with the substrate acting to interconnect and ground the pinning layer and the body of each APS device. The invention also includes the method of making the photosensitive device.

11 Claims, 10 Drawing Sheets

SOI ACTIVE PIXEL CELL DESIGN WITH GROUNDED BODY CONTACT

This application is a division of Ser. No. 09/004,429 filed Jan. 8, 1998, now U.S. Pat. No. 5,877,521.

BACKGROUND OF THE INVENTION

1. Field of the Invention

This invention relates to solid state image sensors, and more particularly, to active pixel sensor (APS) technology.

2. Description of Related Art

Active pixel sensors and charge coupled devices (CCD) are solid state photosensitive devices which are commonly constructed as an array of photosensitive cells, each cell in the array corresponding to a pixel. A typical application for CCD or APS image sensing arrays is in a digital camera or other type of image sensor.

One advantage to APS devices over CCD devices is that APS technology is more compatible with metal oxide semiconductor (MOS) technology. This allows the support electronics needed to read signals from the APS array, and to process those signals, to be constructed on the same chip and at the same time as the APS array itself. This can significantly reduce the total cost of an APS technology based imaging device.

A basic prior art APS device comprises a reverse-biased photosensitive region of semiconductor material that absorbs incident electromagnetic radiation and produces hole-electron pairs. The electrons generated by the incoming light are collected and held in the photosensitive region by the action of a pin diode formed between a pinning layer at the incident surface of the device and the semiconductor material in the photosensitive region.

Incoming electromagnetic radiation first passes through the pinning layer and then into the photosensitive region. Holes generated when the incoming electromagnetic radiation is absorbed are collected and removed from the photosensitive region by the pinning layer and the photodiode formed between the reverse-biased photosensitive region and the substrate. The pinning layer also serves to isolate the stored electrons from the semiconductor surface, which is known to provide significantly more sites for recombination than the silicon bulk.

Electrons generated when the incoming electromagnetic radiation is absorbed in the photosensitive region remain trapped in the photosensitive region until a transfer device removes them. The transfer device is typically a polysilicon gate and an adjacent semiconductor region. The polysilicon gate can be triggered by the application of a potential source to allow current flow between the photosensitive region and the adjacent semiconductor region. The number of electrons trapped in the photosensitive region relates to the intensity of the absorbed electromagnetic radiation and to the duration of exposure of the APS device to the incoming radiation.

Thus, the current flow which occurs when the transfer device is activated determines the brightness at the pixel corresponding to the APS device. With multiple APS devices in an array, each one corresponding to a single pixel, a multiple pixel image can be built up by scanning the APS array and activating the transfer device for each cell to determine the brightness of the image at each pixel.

One difficulty with APS designs is that the amount of charge that can be collected and held in the pin diode is limited by the total reverse potential of the diode. If the APS cell is strongly overexposed, the diode electron charge collected will exceed this limit and forward bias the pin diode. Excess electrons will then spill out and disturb adjacent APS cells. When excess electrons from one cell spill over into adjacent cells, causing those cells to also appear to be strongly illuminated, the disturbance is referred to as "blooming". The excess electrons from overexposed APS pixels can also interfere with the proper operation of other devices on the substrate.

To solve the blooming problem, anti-blooming gates have sometimes been used, however this increases cost and device complexity.

Bearing in mind the problems and deficiencies of the prior art, it is therefore an object of the present invention to provide a photosensitive device including an APS array having excellent isolation between adjacent APS devices in the array.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a photosensitive device including:

a substrate;

an insulating layer formed on the substrate;

a semiconductor layer formed on the insulating layer;

an insulating barrier extending through the semiconductor layer to the insulating layer, the insulating barrier dividing the semiconductor layer into a plurality of cells of semiconductor material; and a plurality of photosensitive active pixel sensors constructed in corresponding ones of the plurality of cells in the semiconductor layer.

The active pixel sensors may be constructed in the cells of semiconductor material in any conventional manner, producing an active pixel sensor having a body, a pinning layer, and a photosensitive region formed below the pinning layer. In most APS applications, it is desirable to connect the body portion and the pinning layer to each other and to ground. In conventional designs, it is relatively easy to make these connections. However in the design of the present invention, the isolated nature of each cell creates difficulties in making this connection.

Accordingly, the present invention also is directed to various constructions of the device which incorporate an integrated connector between the pinning layer and the body, and to methods of making the device, particularly methods which construct this connector from semiconductor material during the method. In one embodiment of the photosensitive device, the semiconductor connector is a semiconductor plug in the form of a vertical column extending from the pinning layer to the body of the active pixel sensor. In this first embodiment, the body and pinning layer of each APS pixel is individually connected by its corresponding plug.

In a second embodiment of the photosensitive device, the semiconductor connector is a trench filled with semiconductor material, the trench extending along one side of the cell containing the active pixel sensor. The trench may extend along only one cell, connecting the body and pinning layer of only that cell, or it may extend along multiple adjacent cells, interconnecting all of the corresponding pinning layers and body portions.

Regardless of whether the filled trench design or the individual vertical plug design is used to make the body to pinning layer connection, it is generally desirable to connect these elements to ground and to the corresponding elements of the other pixel cells. This may be achieved simply by individually connecting wires to each cell when wiring is formed on the surface of the photosensitive device. However, it may also be accomplished by extending the semiconductor connector vertically downward to a depth sufficient to penetrate the insulating layer and reach the substrate, which is made electrically conductive. In this the substrate is usually constructed of semiconductor material.

The present invention relates to both the photosensitive device and the method of making the photosensitive device. The preferred method of making the photosensitive device includes the steps of:

providing a substrate;

depositing an insulating layer on the substrate;

forming a semiconductor layer on the insulating layer;

etching a plurality of trenches into the semiconductor layer, the trenches extending through the semiconductor layer to the insulating layer, the trenches dividing the semiconductor layer into a plurality of isolated cells of semiconductor material;

depositing an insulating material into the trenches to form an insulating barrier extending through the semiconductor layer to the insulating layer, the insulating barrier electrically isolating the semiconductor material in each cell from the semiconductor material in other cells; and constructing an active pixel sensor in the semiconductor material of each cell, each active pixel sensor including a body, a pinning layer and a photosensitive region.

In the most highly preferred method of the invention, the semiconductor connector is constructed during the method utilizing the following steps:

masking the photosensitive device with a body contact mask having openings which leave exposed portions of the insulating material in the trenches, the exposed portions of insulating material being adjacent to each active pixel sensor;

etching the insulating material through the body contact mask to a depth sufficient to reach the body of each active pixel sensor; and depositing semiconductor material in the etched locations to connect the body of each active pixel sensor to the corresponding pinning layer of each active pixel sensor.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 3–5, 7, 9 and 10 are all cross sectional views of the device seen from the side. FIGS. 6 and 8 are top plan views of the device.

DESCRIPTION OF THE PREFERRED EMBODIMENTS(s)

In describing the preferred embodiment of the present invention, reference will be made herein to FIGS. 1–11 of the drawings in which like numerals refer to like features of the invention.

Figure 1:
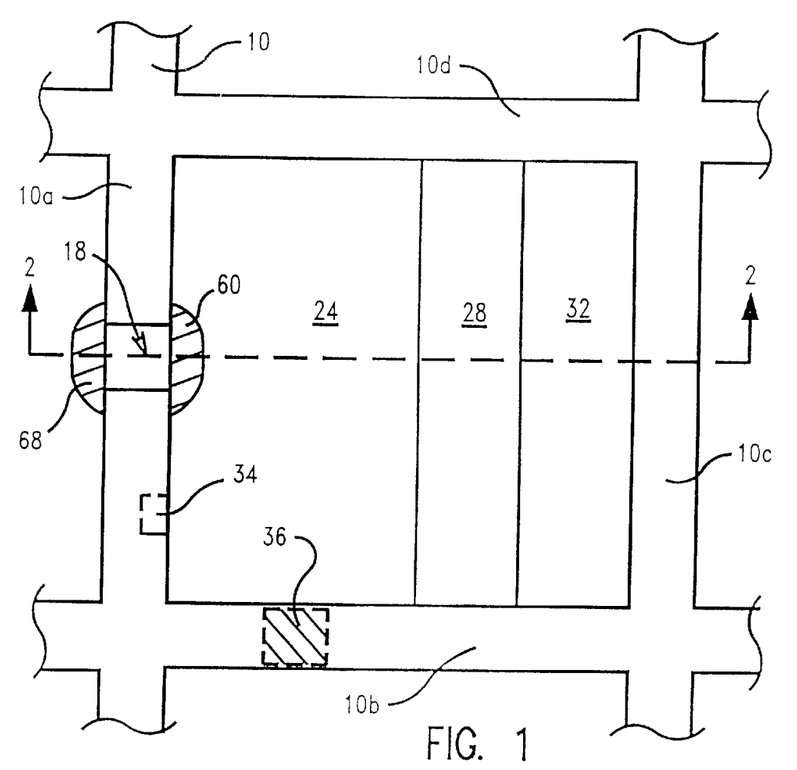
FIG. 1 is a top plan view of a single cell containing an active pixel sensor amid an array of such cells in a first embodiment of the photosensitive device constructed according to the present invention.
Figure 2:
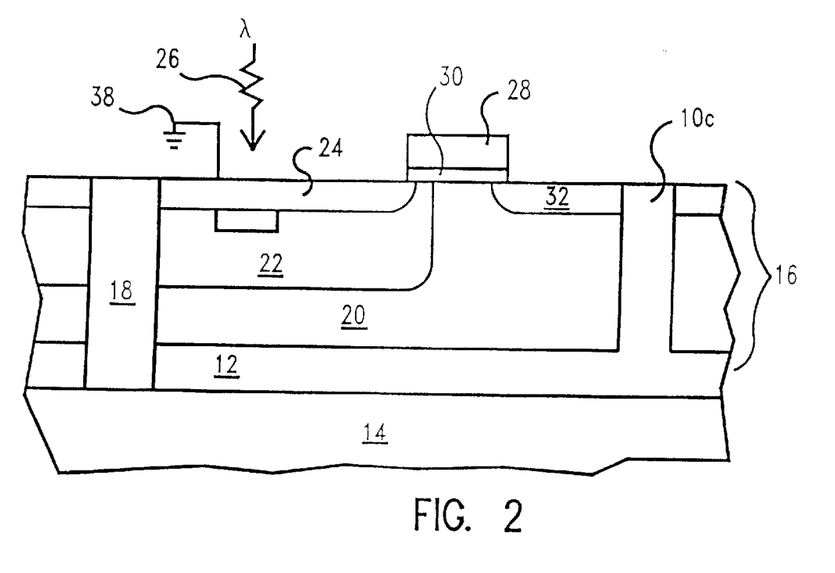
FIG. 2 is a cross-sectional view of the first embodiment of the invention taken along the line 2—2 in FIG.

FIGS. 1 and 2 illustrate a first embodiment of the photosensitive device of the present invention. In this embodiment, each APS device has a separate semiconductor plug in the form of a vertical column of semiconductor material to connect the body of the APS device to its pinning layer.

The present invention comprises a photosensitive device incorporating an array of active pixel sensors devices, each APS device being constructed in an isolated island of silicon surrounded on all sides by a barrier of insulating material, and isolated below by an insulating layer. FIG. 1 provides a top plan view showing a single cell in the array. The cell is surrounded on four sides by insulating barrier 10, the portions of the insulating material surrounding the sides being indicated with reference numerals 10a, 10b, 10c and 10d.

FIG. 2 provides a cross-sectional view of the cell and shows that the cell is constructed on an insulating layer 12 which is formed on a substrate 14. The cell is substantially electrically isolated from each adjacent cell by the combination of the underlying insulating layer 12 and the surrounding insulating barrier 10 which extends from the surface of the device downward until it contacts the insulating layer 12. Each APS device is constructed in its separate and individual island of active silicon which lies within the upper layer 16 of the complete device.

The insulating barrier 10 surrounds all cells in a grid-like matrix of cells. Although rectangular cells are shown, other cell shapes may be used. Also, although the insulating material surrounds each cell, the design also includes various electrical connections formed by wiring or by connectors of semiconductor material that interconnect some portions of the cells where desired. These connectors may penetrate or replace portions of the insulating barrier to make the interconnections as described in greater detail below.

The insulating layer 12 and the insulating barrier 10 are preferably formed of the same type of oxide typically used in shallow trench isolation (STI) during conventional metal oxide semiconductor (MOS) fabrication.

The APS device constructed in each cell is substantially conventional with the exception of the semiconductor connector plug 18. The APS cell comprises a body portion 20 constructed of the semiconductor material in layer 16, a photosensitive region 22 and a pinning layer 24. Incoming radiation of a wavelength $\lambda$ indicated with reference numeral 26 passes through the pinning layer 24 into the photosensitive region 22 where it is absorbed, creating hole-electron pairs. Electrons remain stored in the photosensitive region 22 until the transfer gate 28 is turned on. Transfer gate 28 is isolated from the base material 20 by oxide insulator 30, and when turned on, current flows between the photosensitive region 22 and the adjacent semiconductor region 32.

As can be seen in FIG. 1, the pinning layer 24, gate 28 and adjacent semiconductor region 32, substantially cover the surface of the cell, preventing access from the top of the cell to the body region 20 buried within it. However, for the APS device to function properly, the body region 20 needs to be connected to the pinning layer 24. This is achieved in this first embodiment of the invention through the use of the semiconductor connector plug 18. The plug 18 extends in a vertical column downward from the surface of the cell to at least the depth of the body region 20, providing a vertical conduction path between the pinning layer 24 and the body portion 20.

Various positions for the semiconductor connector 18 may be used, and two alternative sizes and locations for this connector are drawn in phantom at positions 34 and 36. Semiconductor connector 18 is shown as having a width which is equal to the width of the insulating barrier 10a. This forms a connection path across the insulating barrier portion 10a to the cell to the left of the connector 18. Accordingly, in this configuration the cell to the left of the connector 18 must have a mirror image symmetry to the cell on the right of connector 18 to avoid interference with the transfer device in the adjacent cell. This type of symmetry is shown in greater detail in FIG. 11.

Alternatively, when the semiconductor connector is positioned at location 36, the cells in the entire array may all have the same orientation with the APS pixel on the left of the cell and the transfer device on the right of the cell. Yet another alternative location for the semiconductor connection to the body is shown at location 34. In this alternative, the width of the semiconductor connector is less than the width of the insulating barrier 10a. The excess width of the insulating barrier 10a acts to isolate the adjacent cells regardless of the orientation and relative positioning of the APS device in each cell.

The depth of the semiconductor connector 18 may also be varied. As shown in FIG. 2, the depth of the semiconductor connector plug 18 is great enough to completely penetrate the underlying insulating layer 12 and contact the substrate 14. In the preferred embodiment, substrate 14 is silicon. When the semiconductor connector plug 18 penetrates the underlying insulating layer 12, the silicon substrate 14 may be used to interconnect all of the connector plugs for all of the individual cells in the photosensitive device.

Substrate 14 will normally be grounded, and each connector plug 18 will thereby ground each body portion 20 and each pinning layer 24 through the substrate 14. The pinning layer of each APS device may also be grounded separately by wiring (not shown) as schematically indicated by the grounding connection marked with reference numeral 38.

In an alternative embodiment, the connector plug 18 need not penetrate through the insulating layer 12. It only needs to penetrate sufficiently far to contact the body portion 20 and connect it to the pinning layer. In this type of embodiment, either the connector plug 18 or the pinning layer 24 will be separately connected to ground through separate wiring added at a subsequent point during construction.

In the designs shown, the insulating layer 12 and the insulating barrier 10 are formed of the same type of oxide typically used in shallow trench isolation (STI) during conventional metal oxide semiconductor (MOS) fabrication. The pinning layer 24 is p− semiconductor material. The body portion 20 is epitaxially grown p-type semiconductor material, and the photosensitive region 22 is n− semiconductor material.

The transfer gate 28 is conventionally formed from n+polysilicon and the adjacent semiconductor region 32 is n+silicon. The connector plug 18 is p+ polysilicon.

FIGS. 3–10 show various steps in the method of making the invention. The device constructed in accordance with these drawings is an alternative embodiment to the embodiment illustrated in FIGS. 1 and 2. The principal differences relate to the location and size of the connector used to make connection to the body 20 of each APS cell, the depth of that connector, the shape of the cells, and the fact that mirror image symmetry is not required.

Figure 3:
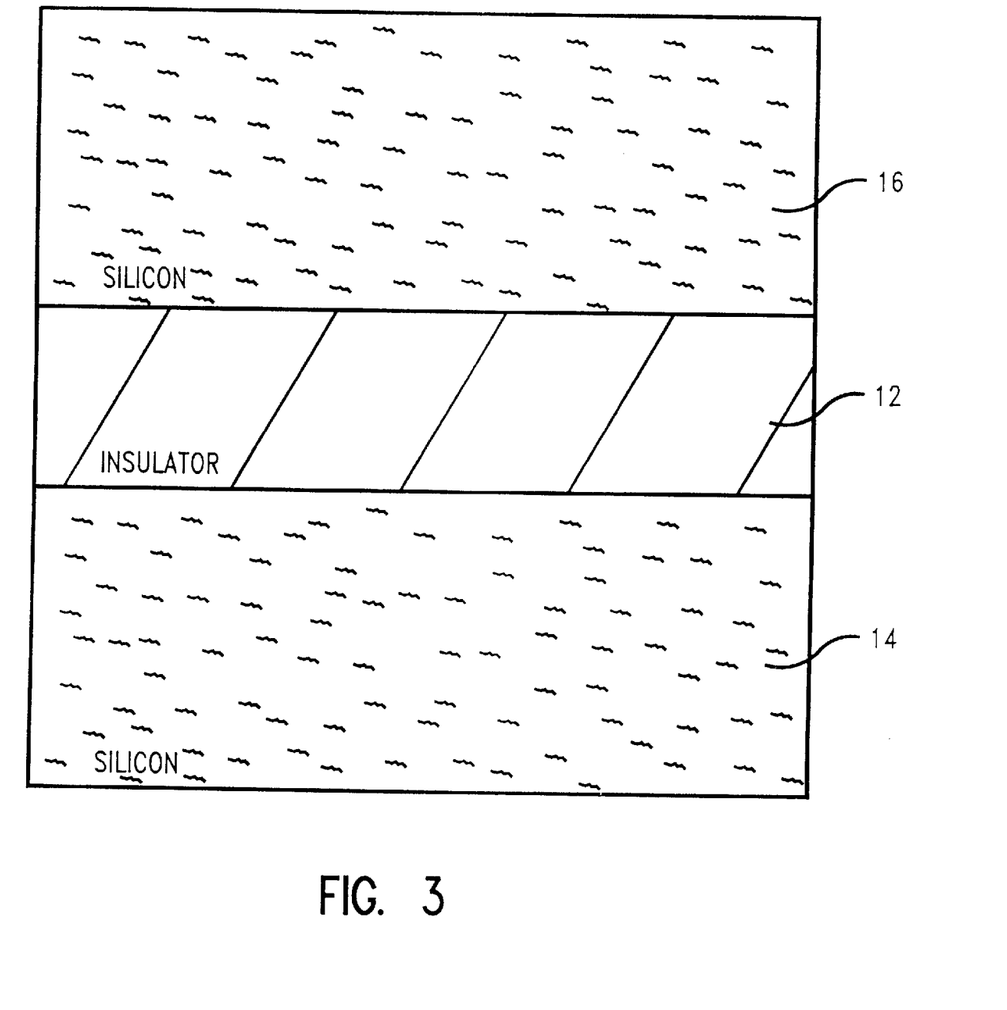
FIGS. 3–10 provide cross-sectional views of a second embodiment of the photosensitive device of the present invention showing illustrative steps in the method of making the invention.

In FIG. 3, a substrate 14, preferably of silicon, has an insulating layer 12 applied to its upper surface. Above the insulating layer 12 is yet another layer of active silicon 16. Preferably this upper layer is a single crystal silicon layer of a thickness appropriate depending upon the collection depth of red light desired or necessary. In the preferred design, this layer has a thickness of approximately 5 micrometers.

The multiple layers illustrated in FIG. 3 may be referred to as a silicon on insulator (SOI) construction. It allows individual isolated islands of the silicon in the upper layer 16 to be defined by etching defining trenches around each island to a depth sufficient to reach the insulator 12.

Figure 4:
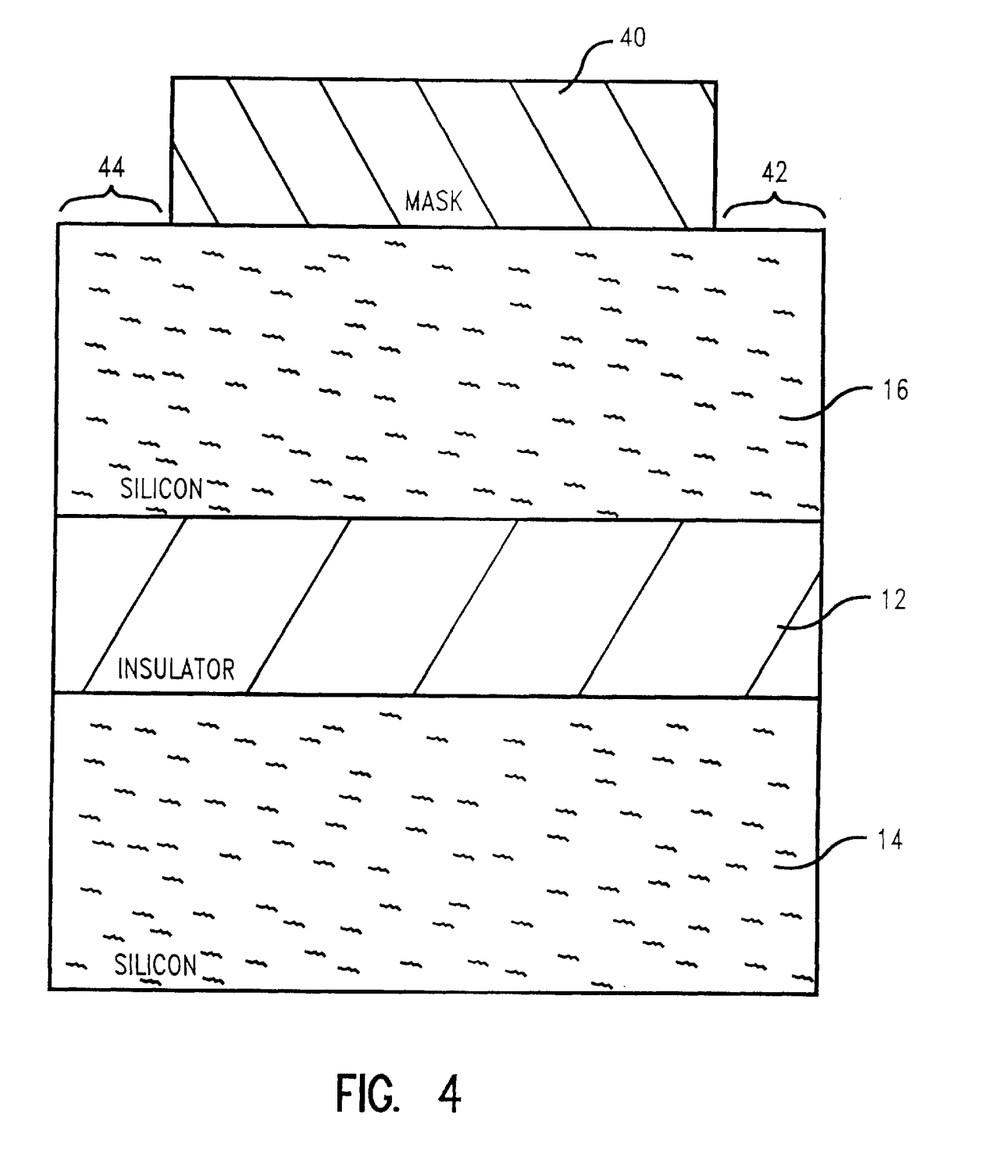

FIG. 4 illustrates the first step in this process in which a cell mask 40 has been applied to the SOI construction of FIG. 3. The mask defines the outer bounds of each island of semiconductor material in the in the multi-element array. The regions 42, 44 are then etched down to the insulating layer 12 and the resulting grid like array of trenches defines the individual islands.

Figure 5:
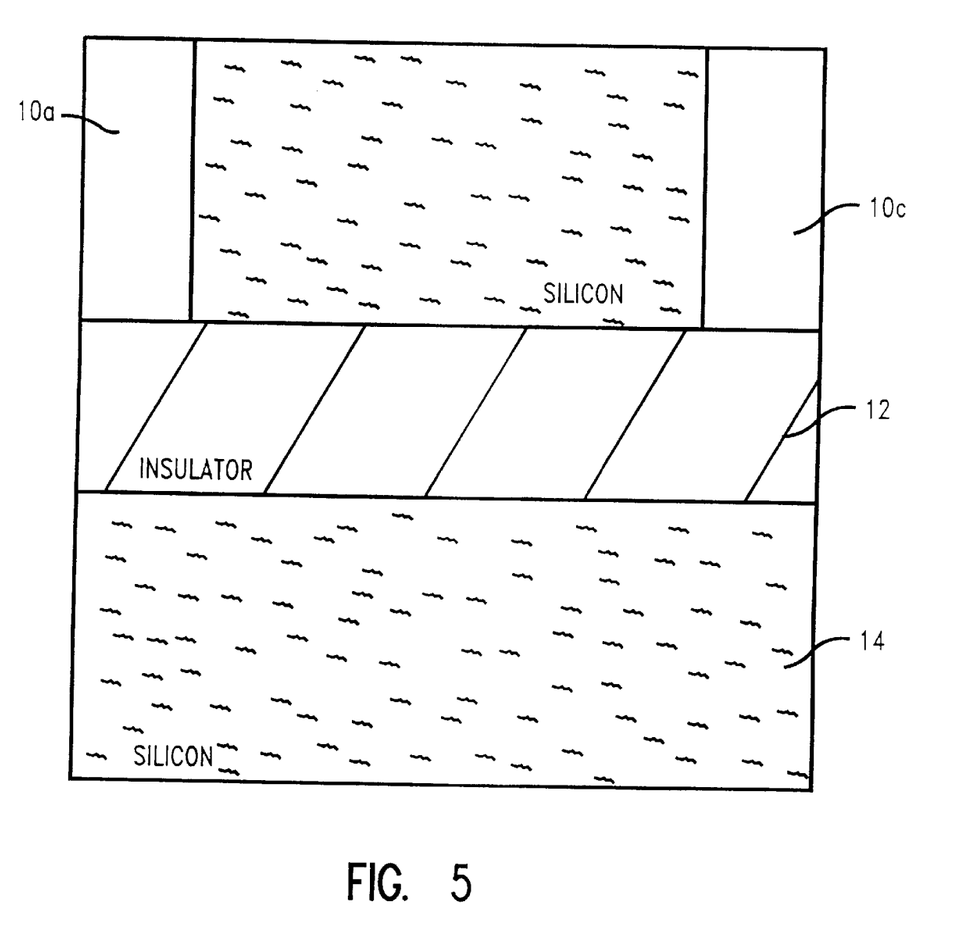
Figure 6:
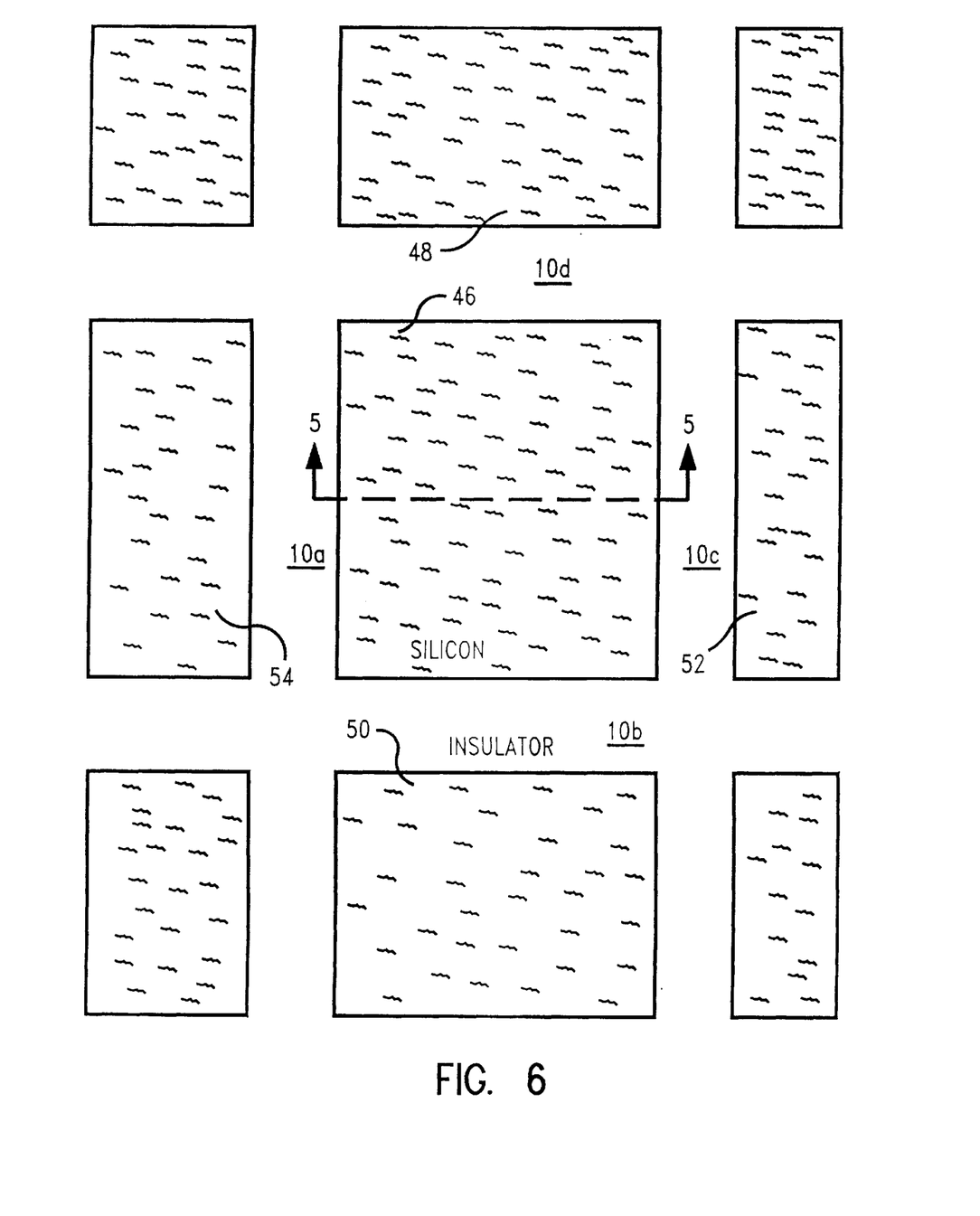

After etching, the trenches surrounding the islands of silicon are then filled with an insulating material, preferably an insulating oxide of the type used in STI isolation and the upper surface is flattened with chemical mechanical polishing to produce the results shown in FIGS. 5 and 6.

FIG. 6 provides a top plan view corresponding to the cross-sectional view shown in FIG. 5. At this stage, the active silicon layer 16 has been cut into individual islands 46, 48, 50, 52, 54, each of which is isolated from each of the other islands by the intervening gridwork of insulating barrier 10.

Individual APS devices and associated transfer transistors could be constructed in each cell at this point. However, the necessary connection to the body 20 of each cell is simplified by the additional processing steps shown in FIGS. 7 and 8.

Figure 7:
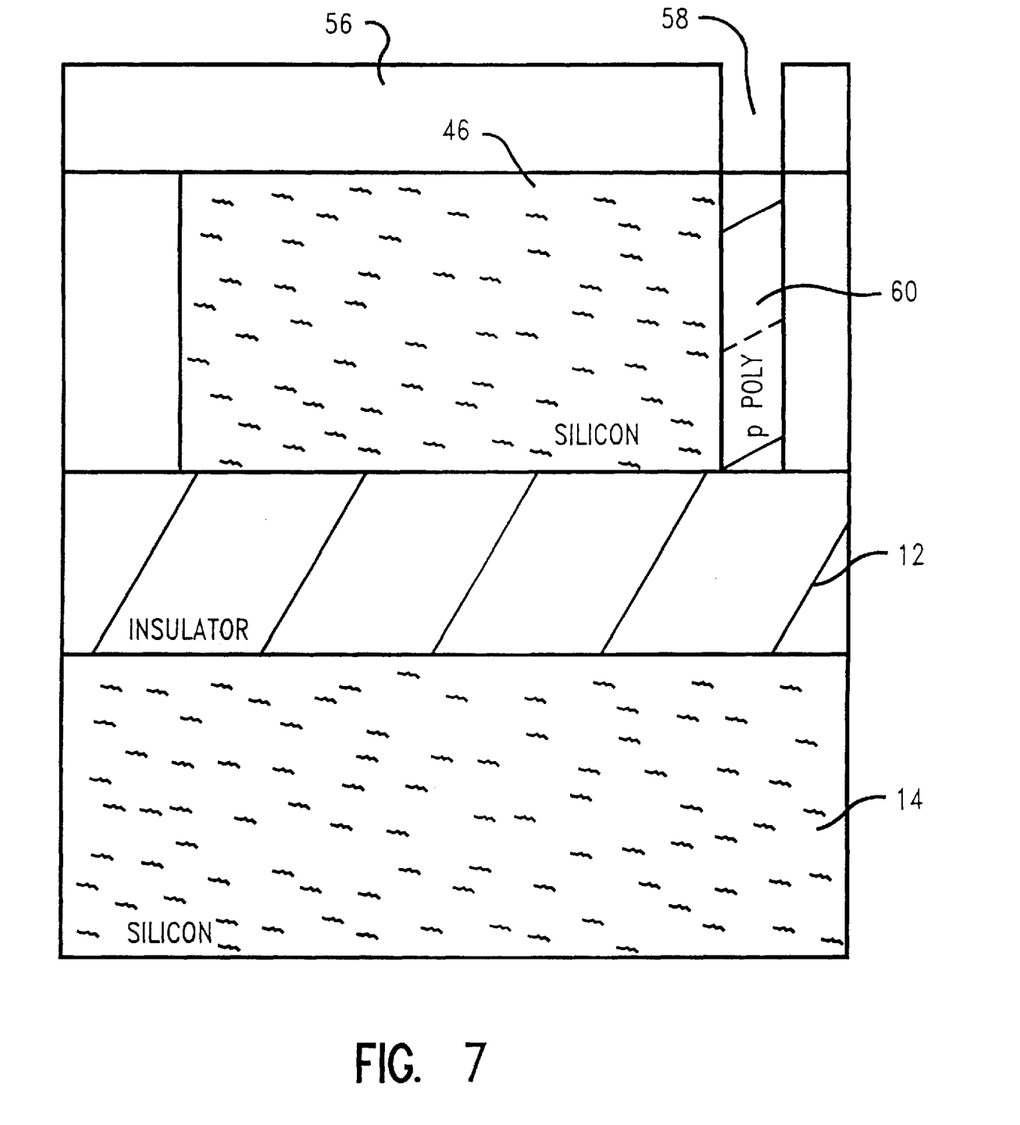

FIG. 7 shows a body contact mask 56 having openings 58 positioned above the upper surface. The body contact openings 58 may be individual openings for each cell to produce the individual vertical column contacts of the type shown FIGS. 1 and 2. However, in this embodiment the body contact openings 58 are long slits. These slits extend along the edge of the cells 46, 48 and 50, allowing trenches to be etched into the oxide layer adjacent to these cells and other cells along the line of the trench.

Figure 8:
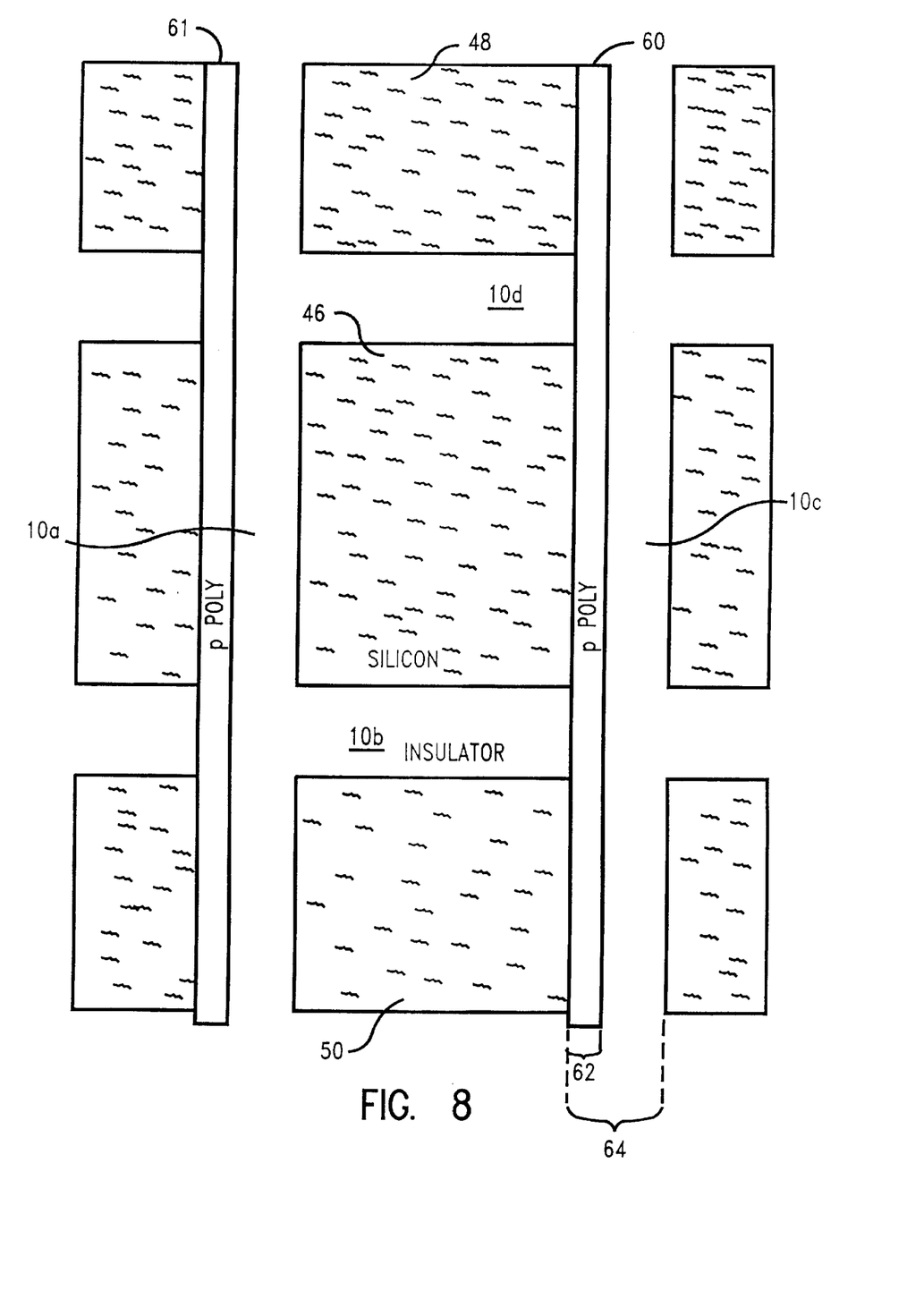

These trenches are subsequently filled with semiconductor material, preferably p+polysilicon, to form semiconductor connector 60. As can be seen in FIGS. 7 and 8, the semiconductor connector 60 has a width 62 which is less than the width 64 of the corresponding portion of the insulating barrier 10c. The process of masking and etching the trench corresponding to slit opening 58 is substantially the same as the corresponding process for etching trenches to isolate the islands 46,48 and 50 of semiconductor material. After deposition of the polysilicon connecting strips 60, 61, the surface is planarized by chemical mechanical polishing.

In this embodiment, as can be seen in FIG. 7, the semiconductor connector 60 extends only down to the insulating layer 12 and does not contact silicon layer 14. Even though the substrate 14 is not contacted, the individual strips of semiconductor connector 60, 61 may be interconnected by other wiring added in a subsequent step.

Figure 9:
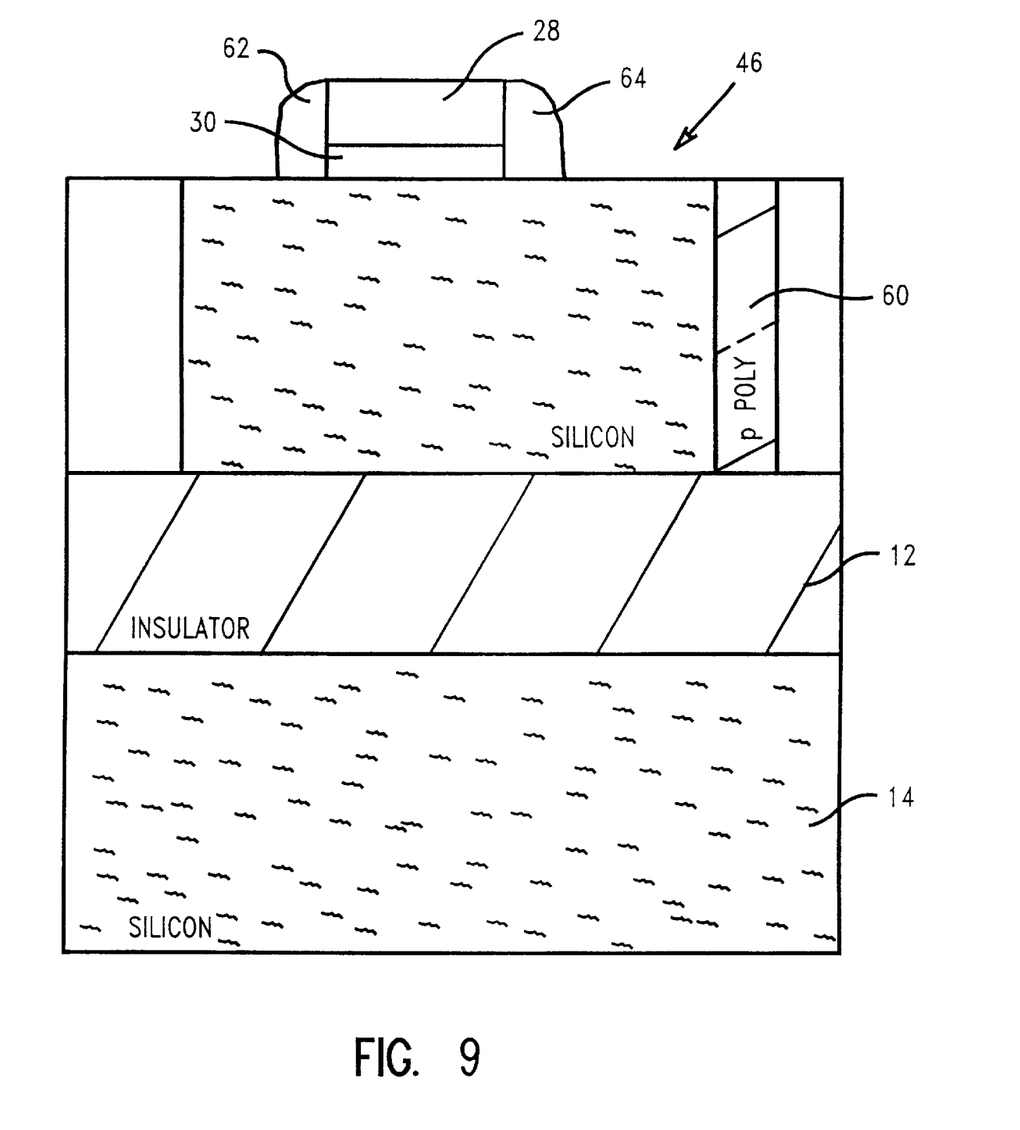
Figure 10:
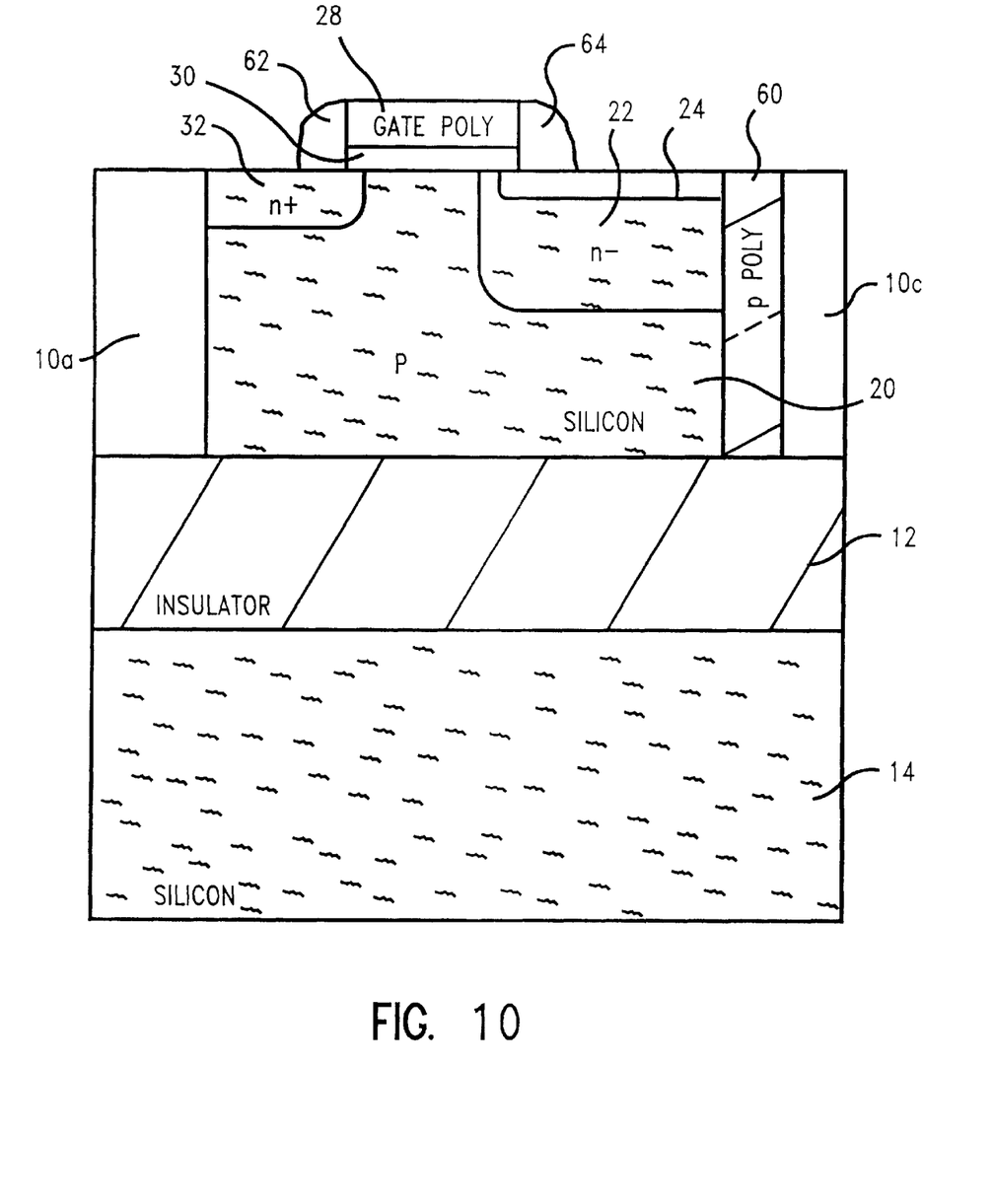

The construction of FIGS. 7 and 8 is now ready for conventional production steps to produce active pixel sensor devices and transfer devices in each cell. FIG. 9 illustrates one intermediate stage after the completion of numerous conventional APS construction steps. Gate 28 has been formed over oxide layer 30 with spacers 62 and 64 on either side. FIG. 10 shows the construction after numerous additional steps. At this point the APS device and associated transfer device are substantially complete. All that remains is to make the various desired wiring interconnections for the particular application.

It should be noted, as shown in FIG. 1, that during construction of the device, some p– outdiffusion will occur into the cell areas as indicate by areas 66 and 68. Due to the relatively large surface area of region 24, this outdiffusion is not a significant problem. In the preferred embodiment, the n+ minus regions, the p– pinning layer 24 and the n– regions are ion implanted. The transfer gate is defined using standard techniques.

The choice between making individual body contacts 18, 34, 36 of the type seen in FIGS. 1 and 2 or longer body contact strips 60, 61 of the type seen in FIG. 8, as well as decisions as to the width of these contacts, the depth of the connections, the use of substrate layer 14 to interconnect and ground the body portions, etc. will all be made on a case by case basis. Such choices depend upon the particular photosensitive device being constructed and the advantages or difficulties of integrating the various steps into the steps required elsewhere in the construction process.

Figure 11:
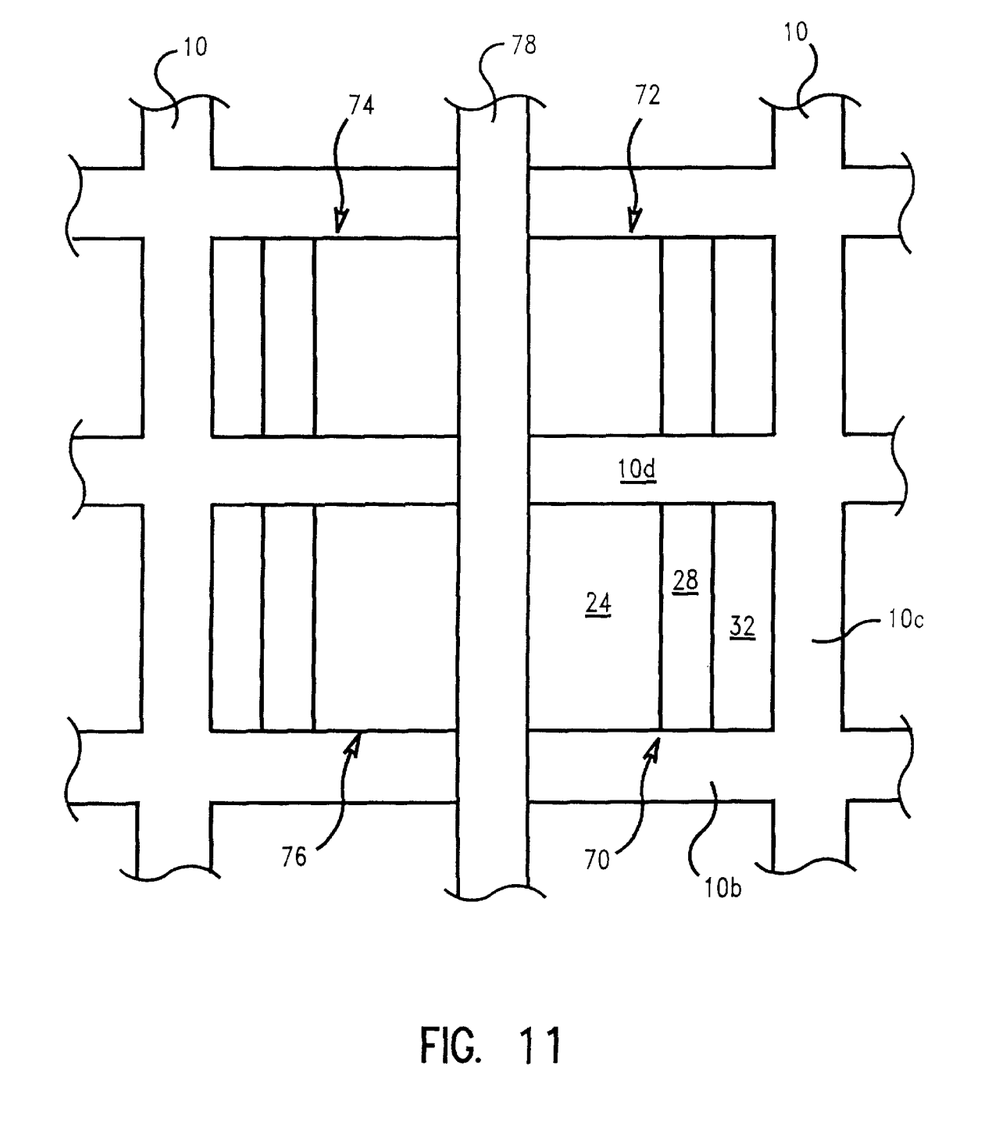
FIG. 11 is a top plan view of four adjacent active pixel sensor cells amid an array of such cells in a preferred embodiment of the photosensitive device constructed according to the present invention.

FIG. 11 illustrates a highly preferred embodiment of the invention in which four cells, 70, 72, 74 and 76 are illustrated.

Cell 70 corresponds substantially to the single cell illustrated in FIG. 1 including the pinning layer 24, the transfer gate 28 and the adjacent semiconductor region 32. Cell 72 is identical to cell 70 and cell 74 and 76 are also identical except that they are mirror images thereof. Cell 70 is surrounded on three sides by the oxide barrier composed of portions 10b, 10c and 10d. The portion of oxide barrier which corresponds to 10a in FIG. 1 has been completely replaced by semiconductor connector 78.

Semiconductor connector 78 has a width which is equal to the width of portion semiconductor barrier portion 10a, in the same manner as semiconductor connector 18 included a width equal to the width of insulating barrier portion 10a in FIG. 1. However, semiconductor connector 78 is shaped as a long strip in the same manner as semiconductor connector 60 and 61 in FIG. 8.

The depth of semiconductor connector 78 is at least sufficient to reach the insulating layer and may optionally be sufficient deep to penetrate that layer and contact the underlying substrate layer 14.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making a photosensitive device comprising the steps of:
   providing a substrate;
   depositing an insulating layer on the substrate;
   forming a semiconductor layer on the insulating layer;
   etching a plurality of trenches into the semiconductor layer, the trenches extending through the semiconductor layer to the insulating layer, the trenches dividing the semiconductor layer into a plurality of isolated cells of semiconductor material;
   depositing an insulating material into the trenches to form an insulating barrier extending through the semiconductor layer to the insulating layer, the insulating barrier electrically isolating the semiconductor material in each cell from the semiconductor material in other cells; and
   constructing an active pixel sensor in the semiconductor material of each cell, each active pixel sensor including a body, a pinning layer and a photosensitive region.

2. A method of making a photosensitive device according to claim 1 further including the step of electrically connecting the body of each active pixel sensor to the corresponding pinning layer of each active pixel sensor.

3. A method of making a photosensitive device according to claim 2 wherein the step of electrically connecting the body of each active pixel sensor to the corresponding pinning layer of each active pixel sensor comprises the steps of:
   masking the photosensitive device with a body contact mask having openings which leave exposed portions of the insulating material in the trenches, the exposed portions of insulating material being adjacent to each active pixel sensor;
   etching the insulating material through the body contact mask to a depth sufficient to reach the body of each active pixel sensor; and
   depositing semiconductor material in the etched locations to connect the body of each active pixel sensor to the corresponding pinning layer of each active pixel sensor.

4. A method of making a photosensitive device according to claim 3 wherein the openings in the body contact mask correspond to the active pixel sensors and the semiconductor material deposited in the etched locations forms a semiconductor plug in the form of a vertical column individually connecting the body of each active pixel sensor to the corresponding pinning layer of each active pixel sensor.

5. A method of making a photosensitive device according to claim 3 wherein each opening in the body contact mask corresponds to multiple active pixel sensors and the deposited semiconductor material forms a semiconductor strip electrically connecting together the bodies and pinning layers of the multiple active pixel sensors.

6. A method of making a photosensitive device according to claim 3 wherein the step of etching the insulating material through the body contact mask includes etching the insulating material through the body contact mask to a depth sufficient to reach the substrate, and wherein the substrate is a semiconductor material.

7. A method of making a photosensitive device according to claim 3 wherein each opening in the body contact mask has a width that is less than the width of the trench containing the insulating material exposed through each opening.

8. A method of making a photosensitive device according to claim 1 wherein the step of constructing an active pixel sensor in the semiconductor material of each cell includes the step of reversing the orientation of selected active pixel sensors located adjacent to other active pixel sensors and constructing the photosensitive region of the adjacent active pixel sensors such that the photosensitive regions lie along a common insulating barrier separating the adjacent active pixel sensors.

9. A method of making a photosensitive device according to claim 8 further including the step of electrically connecting the body of each active pixel sensors to the corresponding pinning layer of each active pixel sensor.

10. A method of making a photosensitive device according to claim 9 wherein the step of electrically connecting the body of each active pixel sensor to the corresponding pinning layer of each active pixel sensor includes the step of electrically connecting together the body and the pinning layer of the adjacent active pixel sensors.

11. A method of making a photosensitive device according to claim 10 wherein the step of electrically connecting together the body and the pinning layer of the adjacent active pixel sensors includes the steps of:

masking with a body contact mask having openings which leave exposed portions of the insulating material in the trench defining the common insulating barrier between the adjacent active pixel sensors;

etching the insulating material through the body contact mask to a depth sufficient to reach the bodies of the adjacent active pixel sensor; and depositing semiconductor material in the etched locations to connect the bodies and the pinning layers of the adjacent active pixel sensors.

* * * * *

UNITED STATES PATENT AND TRADEMARK OFFICE
CERTIFICATE OF CORRECTION

PATENT NO. : 6,258,636 B1
DATED : July 10, 2001
INVENTOR(S) : J. Johnson et al.

Page 1 of 1

It is certified that error appears in the above-identified patent and that said Letters Patent is hereby corrected as shown below:

<u>Column 6,</u>
Line 27, after "in the" delete "in the".

Signed and Sealed this

Twenty-ninth Day of January, 2002

Attest:

JAMES E. ROGAN
Attesting Officer    Director of the United States Patent and Trademark Office